(12) United States Patent
Worones

(10) Patent No.: US 8,922,195 B2
(45) Date of Patent: Dec. 30, 2014

(54) SIMPLIFIED JAW ASSEMBLY FOR A CLAMP METER

(75) Inventor: Jeff Worones, Seattle, WA (US)

(73) Assignee: Fluke Corporation, Everett, WA (US)

( * ) Notice: Subject to any disclaimer, the term of this patent is extended or adjusted under 35 U.S.C. 154(b) by 470 days.

(21) Appl. No.: 13/018,319

(22) Filed: Jan. 31, 2011

(65) Prior Publication Data

US 2012/0169324 A1 Jul. 5, 2012

Related U.S. Application Data

(63) Continuation-in-part of application No. 29/382,283, filed on Dec. 30, 2010, now Pat. No. Des. 665,282.

(60) Provisional application No. 61/429,384, filed on Jan. 3, 2011.

(51) Int. Cl.
*G01R 1/20* (2006.01)
*G01R 1/22* (2006.01)

(52) U.S. Cl.
CPC ........................................ *G01R 1/22* (2013.01)
USPC .......................... 324/127; 324/126; 324/99 D

(58) Field of Classification Search
CPC .................................... G01R 1/20; G01R 1/22
USPC .............. 324/76.77, 110, 114–115, 126–127, 324/555, 99 D
See application file for complete search history.

(56) References Cited

U.S. PATENT DOCUMENTS

| 5,250,640 | A | * | 10/1993 | Irie et al. ........................ 526/88 |
| D359,006 | S | | 6/1995 | McCain et al. |
| 5,825,175 | A | * | 10/1998 | Selcuk ...................... 324/117 H |
| 6,043,640 | A | * | 3/2000 | Lauby et al. .................. 324/127 |
| 6,164,226 | A | * | 12/2000 | Takei ....................... 112/475.06 |
| 7,205,757 | B2 | * | 4/2007 | Itoh et al. .................. 324/117 R |
| 7,439,726 | B2 | * | 10/2008 | Luo et al. ...................... 324/127 |
| 7,825,655 | B1 | * | 11/2010 | Stabel et al. ............. 324/207.15 |
| D636,689 | S | | 4/2011 | Laurino et al. |
| D640,152 | S | | 6/2011 | Laurino et al. |
| 8,120,350 | B2 | | 2/2012 | Shah et al. |
| 2006/0055399 | A1 | * | 3/2006 | Georgeson et al. ........... 324/232 |
| 2009/0058399 | A1 | * | 3/2009 | Wang et al. ................... 324/127 |
| 2010/0283491 | A1 | * | 11/2010 | Zurek et al. ................... 324/713 |
| 2013/0314964 | A1 | * | 11/2013 | Yoshikawa .................... 363/131 |

FOREIGN PATENT DOCUMENTS

JP 08015321 A * 1/1996
JP 2001337112 A * 12/2001

* cited by examiner

*Primary Examiner* — Arleen M Vazquez
*Assistant Examiner* — Robert P Alejnikov, Jr.
(74) *Attorney, Agent, or Firm* — Christensen O'Connor Johnson Kindness PLLC

(57) ABSTRACT

A current clamp meter includes a current meter body and a jaw assembly. The jaw assembly is configured so that the current clamp meter may be used to reach and readily single-out a desired wire from amongst adjacent wires.

26 Claims, 8 Drawing Sheets

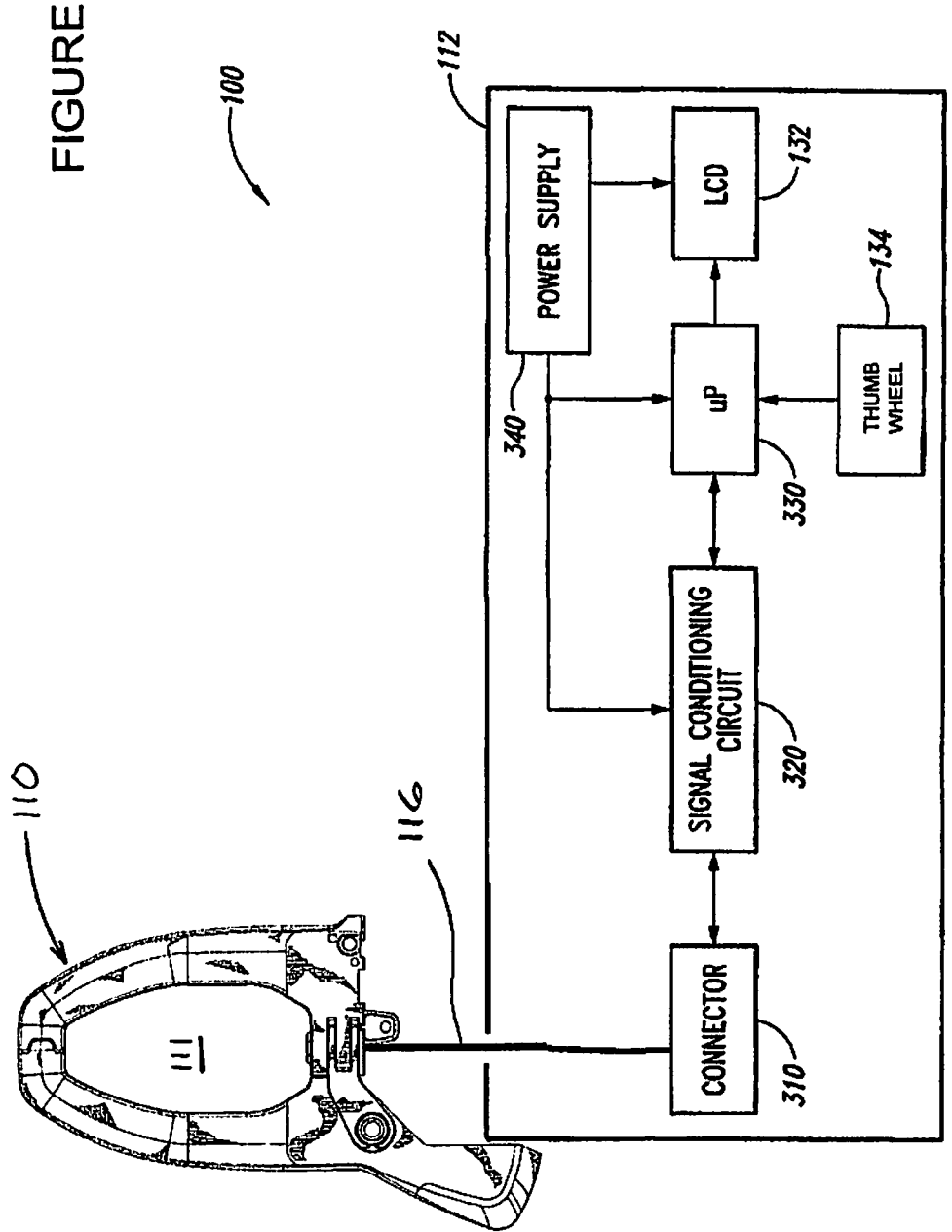

(known art)

SIMPLIFIED JAW ASSEMBLY FOR A CLAMP METER

CROSS-REFERENCE TO RELATED APPLICATION(S)

This patent application is a continuation-in-part of U.S. patent application Ser. No. 29/382,283, filed on 30 Dec. 2010, entitled "Clamp Meter Jaws;" and claims the benefit under 35 U.S.C. §119 of U.S. Provisional Patent Application No. 61/429,384, filed on 3 Jan. 2011, entitled "Simplified Jaw Assembly for a Clamp Meter." Both of these applications are incorporated herein in their entirety by reference.

TECHNICAL FIELD

This invention generally relates to electronic test tools, and more specifically, to a current clamp meter including a jaw assembly that has a reduced cross-section to aid a user in selecting a wire for measuring current through the wire.

BACKGROUND OF THE INVENTION

Electrical current can be measured by connecting a current meter in series with the wire. In many cases, however, disconnecting the wire to connect the current meter can be inconvenient. For example, the wire can be tightly grouped in a bundle with several other wires making it difficult to individually disconnect the wire of interest. Another example of the inconvenience is where a terminal to which the wire is connected is not conveniently located or is inaccessible, requiring the wire to be cut for the current meter to be connected in series. It is time consuming to reconnect the two ends of the cut wire after a measurement is taken, and can be dangerous in situations where relatively high current is carried by the wire. Additionally, the integrity of the wire is compromised by cutting and reconnecting, thus, potentially raising reliability problems.

A clamp probe connected to a conventional multimeter can be used to measure electrical current without the need for disconnecting a wire. The clamp probe is opened, the wire is inserted into the clamp, and the clamp is closed to take a current measurement. The closed clamp includes a core of ferromagnetic material, which when closed, represents the core of a transformer. The wire passing through the clamp represents the primary winding. As known, a current flowing in the wire induces a magnetic flux in the core of the transformer, which in turn, induces a current in a secondary winding of the transformer. Using these physical phenomena, the magnitude and polarity of the current in the clamped wire can be determined based on the current induced in the secondary winding and the characteristics of the transformer formed by the clamped wire.

A known clamp meter is designed with the clamp integrated into the body of the meter, which can provide the convenience of taking a measurement using one hand. That is, only one hand is used to open and close the clamp for clamping a wire and to take a current reading. "One-handed" clamp meters are generally acceptable for applications where the display can be easily viewed by the technician with the meter clamped to the wire for measurement. However, problems with reading the measurement can arise where the wire is difficult to reach or cannot be readily singled-out from amongst adjacent wires.

FIG. 6 illustrates an exploded view of a known jaw assembly. The known jaw assembly includes housings that are split in two approximately equal pieces. In particular, neither housing piece of the known jaw assembly has a volume approximately sufficient to individually contain a current sensing core. Additionally, the known jaw assembly includes separate end caps that are not integrally formed with either piece of the housing. It is therefore more difficult to use the known jaw assembly to select an individual wire from a group of wires because the cross-section of the known jaw assembly is enlarged due to the location of the joints between the housing pieces and the separate end caps.

BRIEF DESCRIPTION OF THE DRAWINGS

FIG. 2 is a simplified block diagram of the clamp meter shown in FIG. 1.

DETAILED DESCRIPTION

The following description and drawings are illustrative and are not to be construed as limiting. Numerous specific details are described to provide a thorough understanding of the disclosure. However, in certain instances, well-known or conventional details are not described in order to avoid obscuring the description.

Without intent to further limit the scope of the disclosure, examples of instruments, apparatus, methods and their related results according to the embodiments of the present disclosure are given below. Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. The use of examples anywhere in this specification including examples of any terms discussed herein is illustrative only, and is not intended to further limit the scope and meaning of the disclosure or of any exemplified term. Likewise, the disclosure is not limited to various embodiments given in this specification.

The terminology used in the description presented below is intended to be interpreted in its broadest reasonable manner, even though it is being used in conjunction with a detailed description of certain specific examples of the invention. Certain terms may even be emphasized below; however, any terminology intended to be interpreted in any restricted manner will be overtly and specifically defined as such in this Detailed Description section.

Certain details are set forth below to provide a sufficient understanding of the invention. However, it will be clear to one skilled in the art that the invention may be practiced without these particular details. Moreover, the particular embodiments of the present invention described herein are provided by way of example and should not be used to limit the scope of the invention to these particular embodiments. In other instances, well-known circuits, controls, and software operations have not been shown in detail in order to avoid unnecessarily obscuring the invention.

Figure 1:
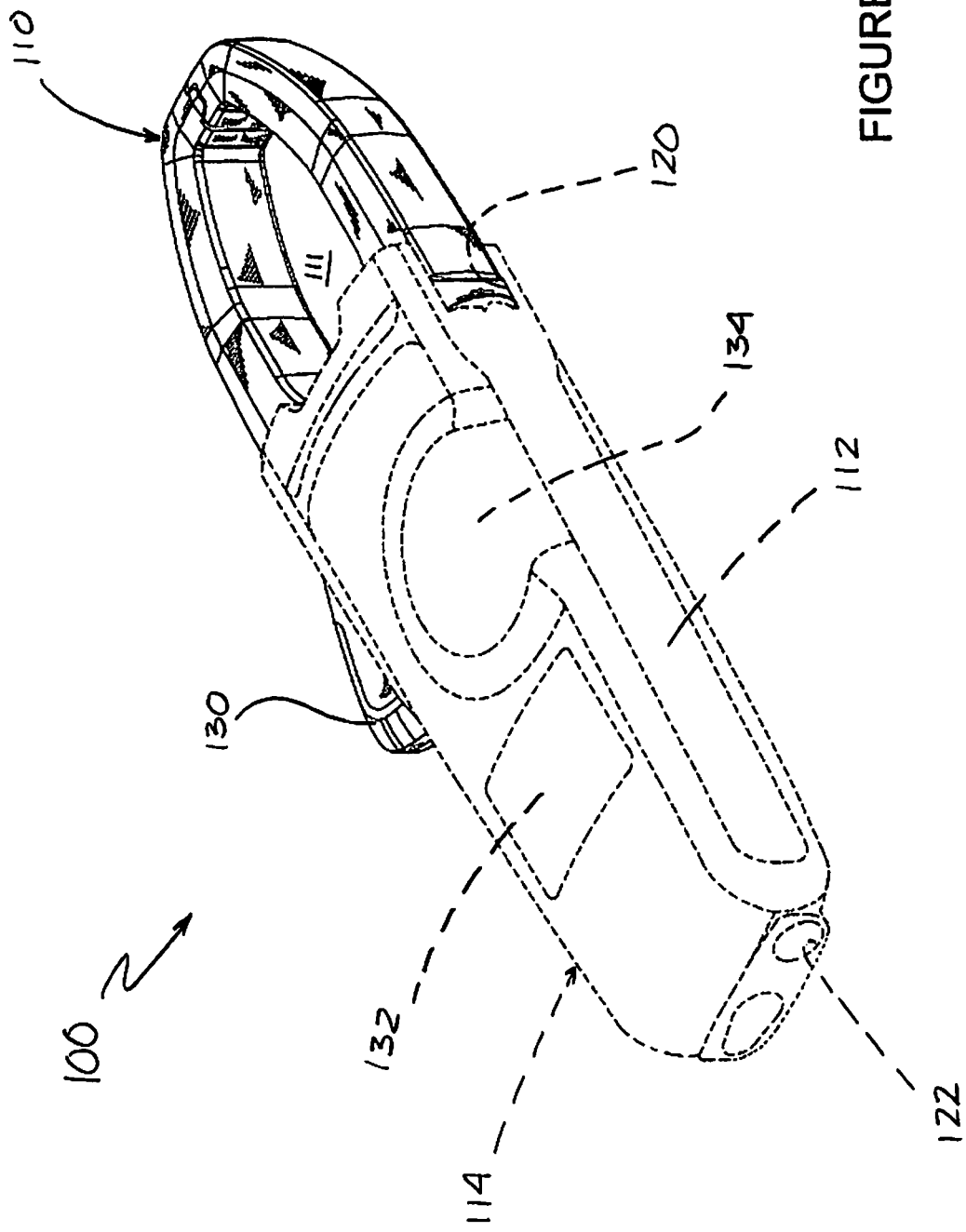
FIG. 1 is a perspective view showing a clamp meter according to an embodiment of the present invention.

FIG. 1 illustrates a clamp meter according to an embodiment of the present invention. As will be described in more detail below, the clamp meter 100 includes a current clamp jaw assembly 110 that is integrated into a housing 112 in which circuitry for the clamp meter 100 is encased. The jaw assembly 110 includes a current sensor for detecting current in a wire (not shown) positioned in an opening 111. Examples of current sensors include Hall-effect devices and coils such as a current transformer, as known in the art. As shown in FIG. 1, the jaw assembly 110 is positioned in a recess 120 in a body 114. The jaw assembly 110 includes a lever portion 130 that is exposed in the recess 120. When depressed, the lever portion 130 configures the jaw assembly 110 in an open arrangement (FIG. 3A) to receive a wire in the opening 111 for measurement. The jaw assembly 110 is a spring loaded device whereupon release of the lever portion 130, the jaw assembly 110 is biased to a closed arrangement (FIG. 3B). Consequently, when the wire is positioned in the opening 111, the lever portion 130 can be released to capture the wire for measurement. The wire can be released from the opening 111 by depressing the lever portion 130 and withdrawing the clamp meter 100.

On a front-side of the meter 100 there is a user interface for receiving input from and providing information to a user. The user interface shown in FIG. 1 includes a display 132 for displaying information, such as a measured value, mode of operation, and device and battery status. The user interface further includes a thumb wheel 134 that can be used to receive input from the user and carry out functions in the meter, for example, turning the meter on and off, selecting a mode of operation, selecting a measurement range, and taking a measurement. Although the present embodiment includes thumb wheel 134, additional or alternative user input devices can be used in other embodiments, such as dials, buttons, and switches. Additionally, the user input devices can be located at different positions than shown in FIG. 1.

The jaw assembly 110 is electrically coupled to circuitry enclosed by the housing 112. FIG. 2 illustrates a simplified block diagram of electrical circuits that can be included in the clamp meter 100. The electrical circuits shown in FIG. 2 are provided by way of example. The circuits included in the clamp meter 100 can be implemented in the meter 100 using conventional designs and operation.

The jaw assembly 110 may be electrically coupled to a connector 310 through a wire 116. Electrical signals generated by the current sensor in the jaw assembly 110 in response to detecting current in a wire positioned in the opening 111 may be provided through the connector 310 to a signal conditioning circuit 320. The signal conditioning circuit 320 can condition the electrical signals, for example, by buffering, filtering, and amplifying the signal. A processor 330 can receive the conditioned signal and compute a current measurement. The processor 330 generates signals to drive a liquid crystal display ("LCD") 132 to display information, including the computed current value. Although not shown in FIG. 2, the current sensor in the jaw assembly 110 may form an electrical connection with circuitry enclosed by the housing without a distinct connector 310 or signal conditioning circuit 320. A processor or controller may include either or both of a connector and signal processing circuit. Additionally, an analog-to-digital converter ("ADC") may be used in addition to, instead or, or part of a signal processing circuit to quantize the conditioned signal into digital information representing the conditioned signal prior to processing by the processor 330. The electrical circuitry in housing 112 may be an application specific integrated circuit (ASIC). Thumb wheel 134 is provided for user input to the processor 330. A power supply 340 provides power to various circuitry of the meter 100, such as the signal conditioning circuit 320, the processor 330, and the LCD 132. The power supply 340 typically includes a battery and power circuits for regulating the provision of power to the circuits in the meter 100. Alternatively, the power supply could be adapted to receive power from an AC source.

In other embodiments of the present invention, the processor 330 is operable to compute measurements for other electrical characteristics, as detected by test probes coupled to electrical terminals 122 further included in the connector 310. For example, multimeter functionality can be integrated into the meter 100, such as measuring voltage and resistance.

Figure 3A:
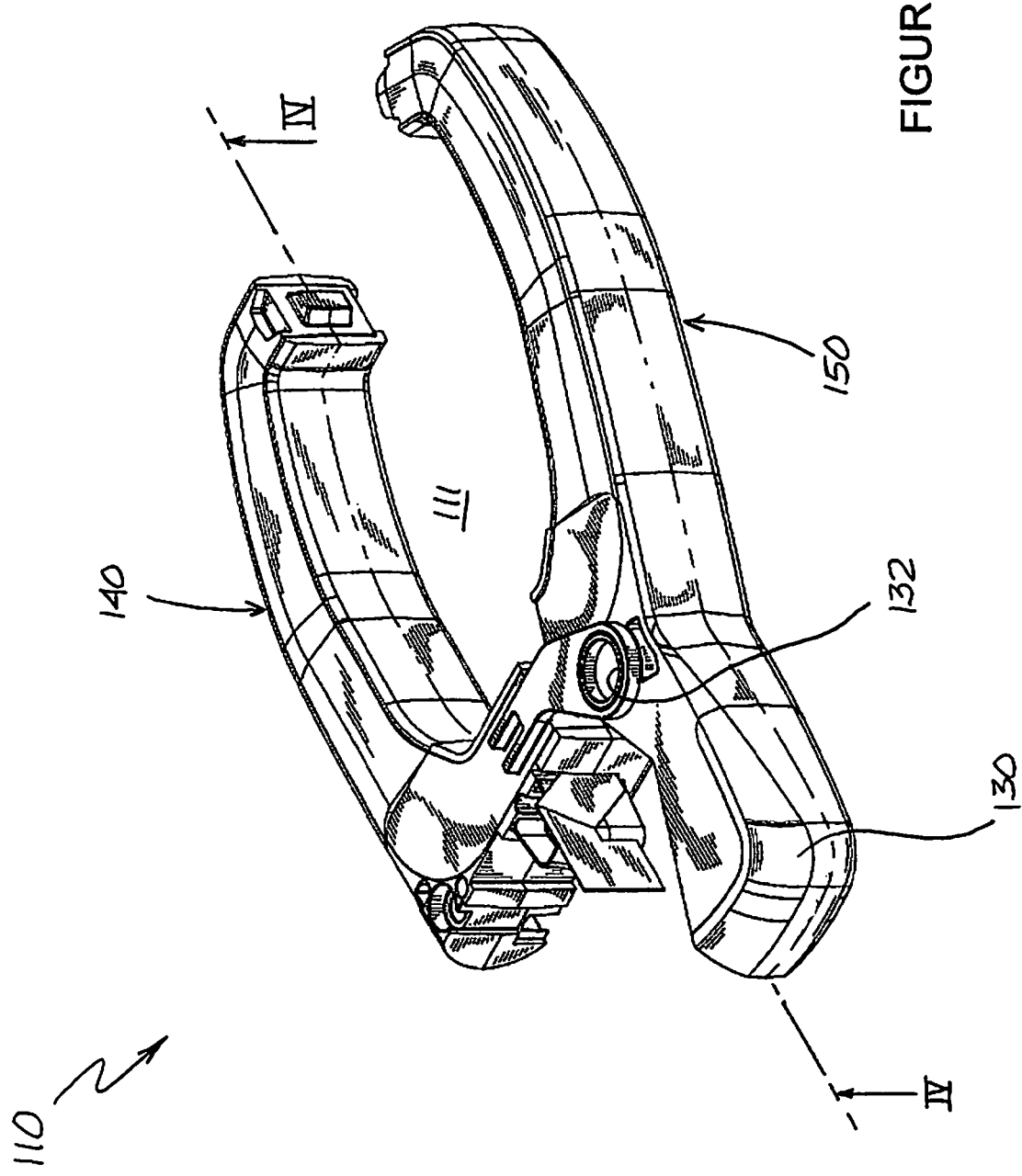
FIG. 3A is a perspective view showing a jaw assembly of the clamp meter shown in FIG. 1 in a closed arrangement.
Figure 3B:
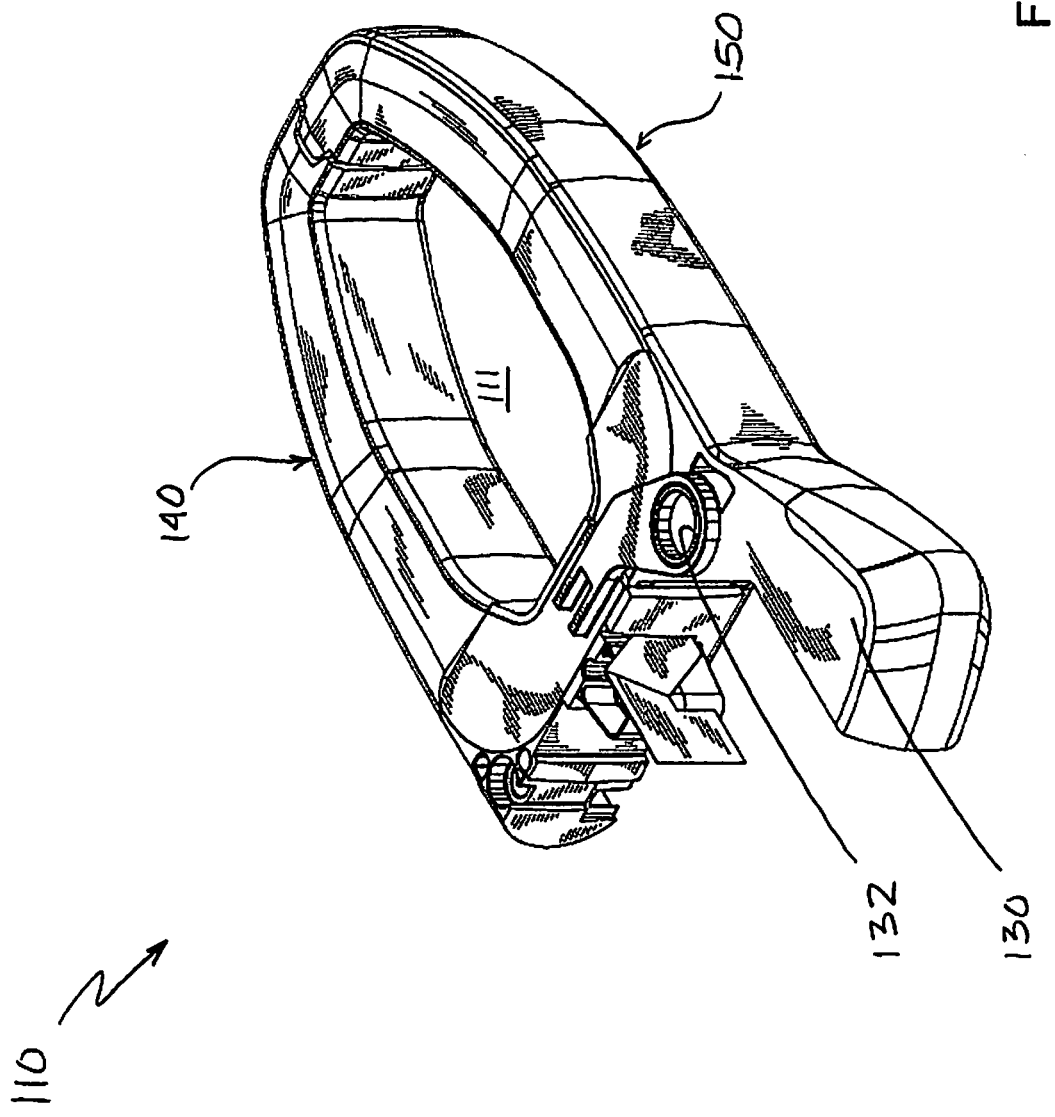
FIG. 3B is a perspective view similar to FIG. 3A showing the jaw assembly in an open arrangement.

FIGS. 3A and 3B illustrate the jaw assembly 110 separated from the housing 112. The open arrangement of the jaw assembly 110 is shown in FIG. 3A and the closed arrangement of the jaw assembly 110 is shown in FIG. 3B. The jaw assembly 110 includes a generally fixed jaw 140 with respect to the housing 112 and a relatively pivotable jaw 150. The pivotable jaw 150 includes the lever portion 130 and is pivotally supported relative to the housing 112 via a pivot 132, e.g., aligned pivot holes.

Figure 4:
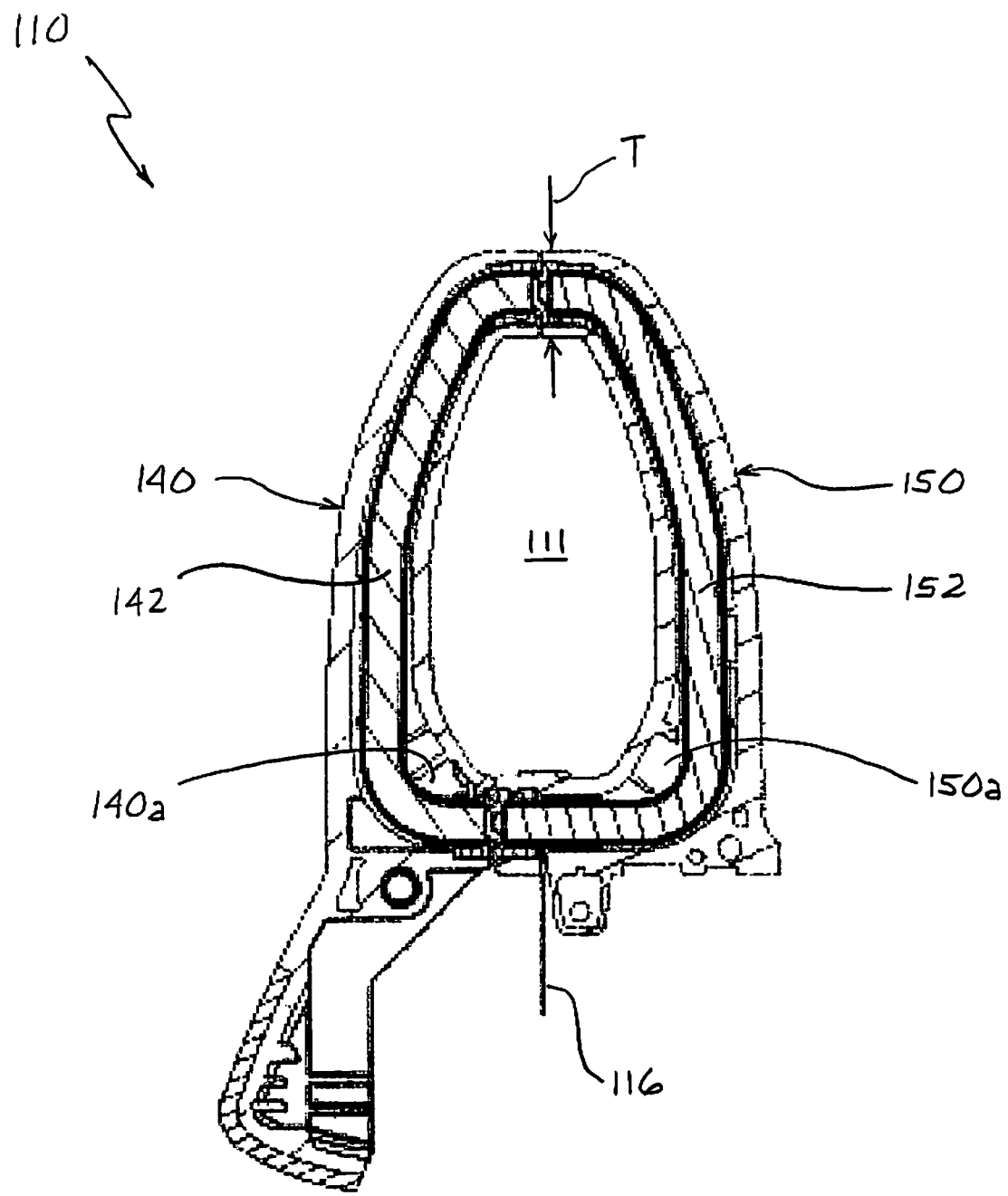
FIG. 4 is a cross-section view of the jaw assembly taken along the chain line IV-IV shown in FIG. 3A.

FIG. 4 illustrates a cross-section of the jaw assembly 110 taken along the chain line IV-IV shown in FIG. 3A. A first portion 142 of the current sensor is disposed in the fixed jaw 140 and a second portion 152 of the current sensor is disposed in the pivotable jaw 150. In the closed arrangement of the jaw assembly 110 shown in FIG. 4, the first and second portion 142 together with the second portion 152 surround the opening 111 and form the current sensor. The output of the current sensor is conducted via the wire 116.

Figure 5:
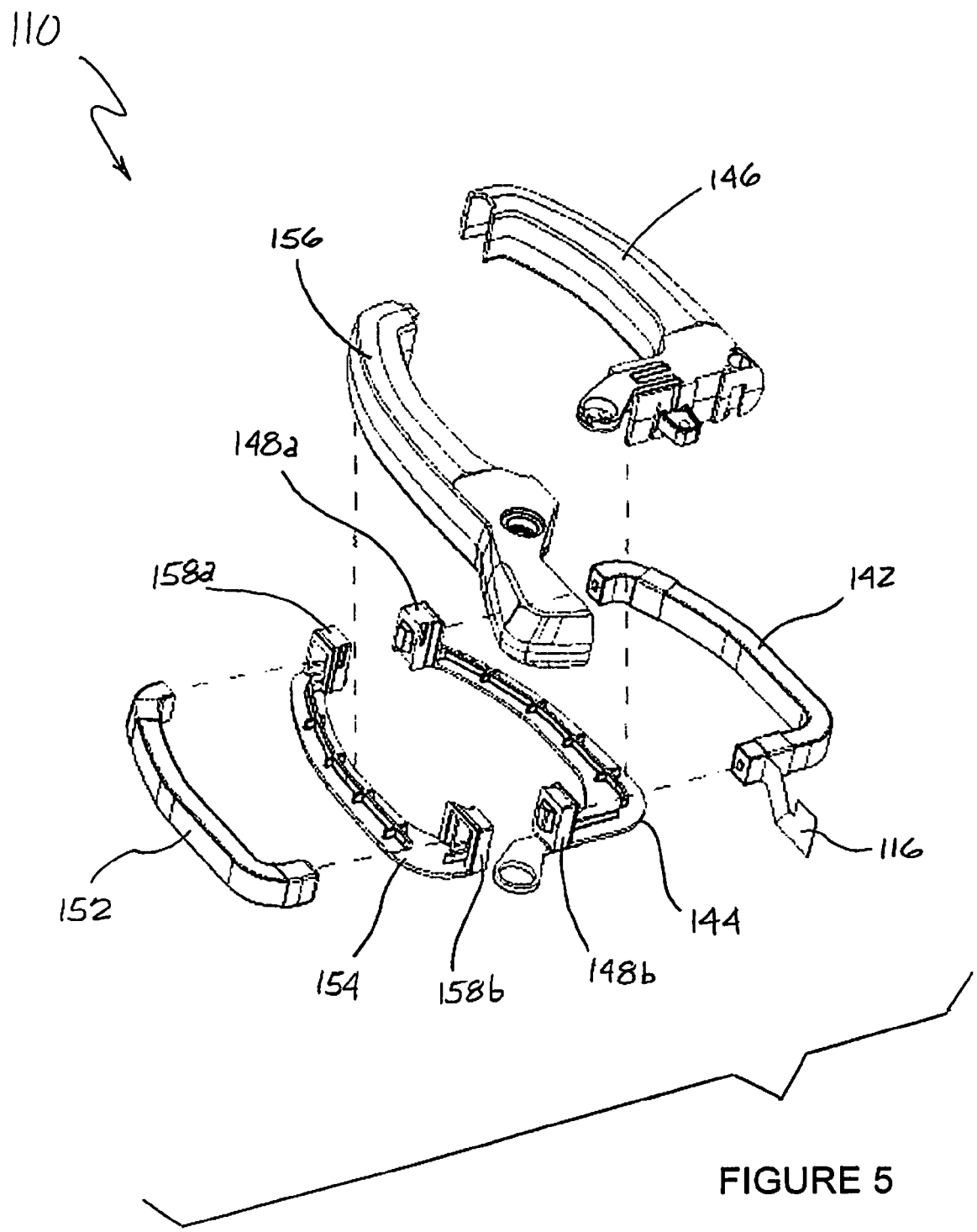
FIG. 5 is an exploded view of the jaw assembly shown in FIG. 3A.

FIG. 5 illustrates an exploded view of the jaw assembly 110. The fixed jaw 140 includes shield having a base 144, a cover 146, a first end cap 148a and a second end cap 148b. Preferably, the cover 146 defines a channel having a volume approximately as large as the first portion 142 of the current sensor. The first portion 142 of the current sensor is therefore received within the cover 146 and the base 144 occludes the channel. Accordingly, the first portion 142 of the current sensor is disposed in a pocket 140a (FIG. 4) defined by the base 144 and the cover 146. The first and second end caps 148 and the base 144 are preferably integrally formed as a monolithic structure and the cover 146 is coupled, e.g., adhered, welded, bonded, etc., to the base 144 to form the pocket 140a. The pivotal jaw 150 similarly includes a shield having a base 154, a cover 156, a first end cap 158a and a second end cap 158b. Preferably, the cover 156 defines a channel having a volume approximately as large as the second portion 152 of the current sensor. The second portion 152 of the current sensor is therefore received within the cover 156 and the base 154 occludes the channel. Accordingly, the second portion 152 of the current sensor is disposed in a pocket 150a (FIG. 4) defined by the base 154 and the cover 156. The first and second end caps 158 are preferably integrally formed as a monolithic structure with the base 154 and the cover 156 is coupled, e.g., adhered, welded, bonded, etc., to the base 154 to form the pocket 150a.

Figure 6:
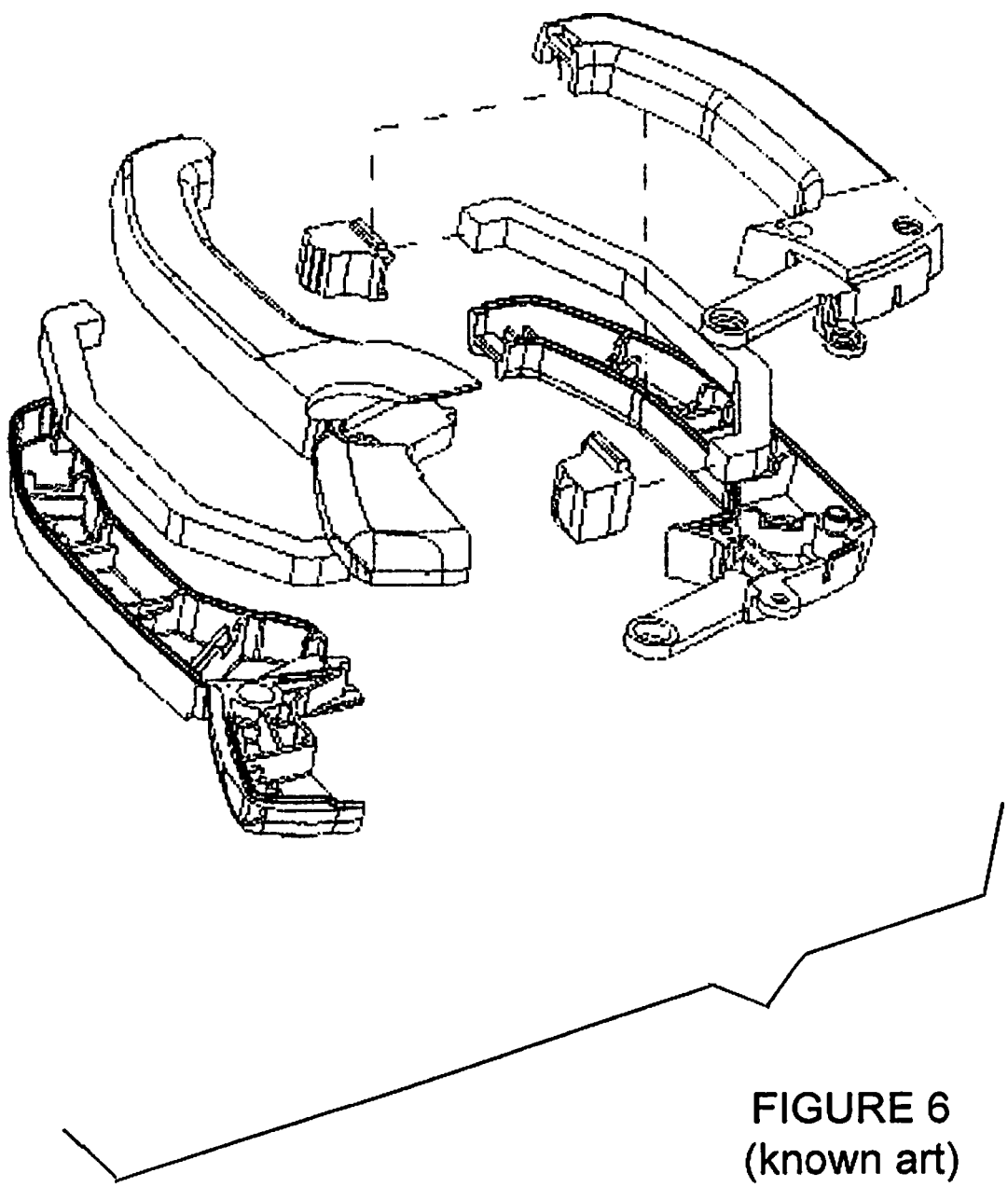
FIG. 6 is an exploded view of a known clamp meter.
Figure 7A:
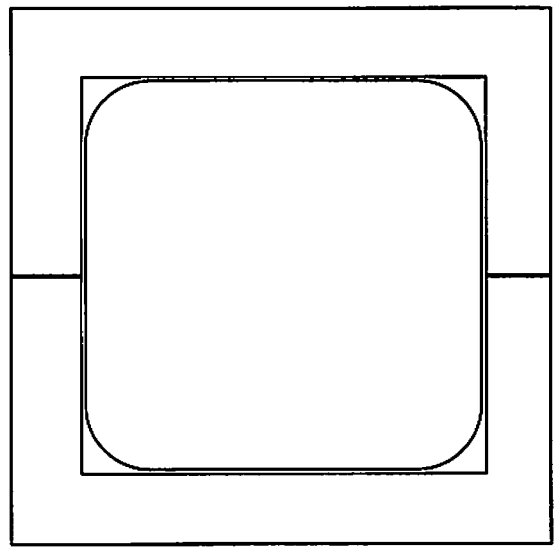
FIGS. 7A and 7B are cross-section views comparing the known clamp meter shown in FIG. 6 and the clamp meter shown in FIG. 1.
Figure 7B:
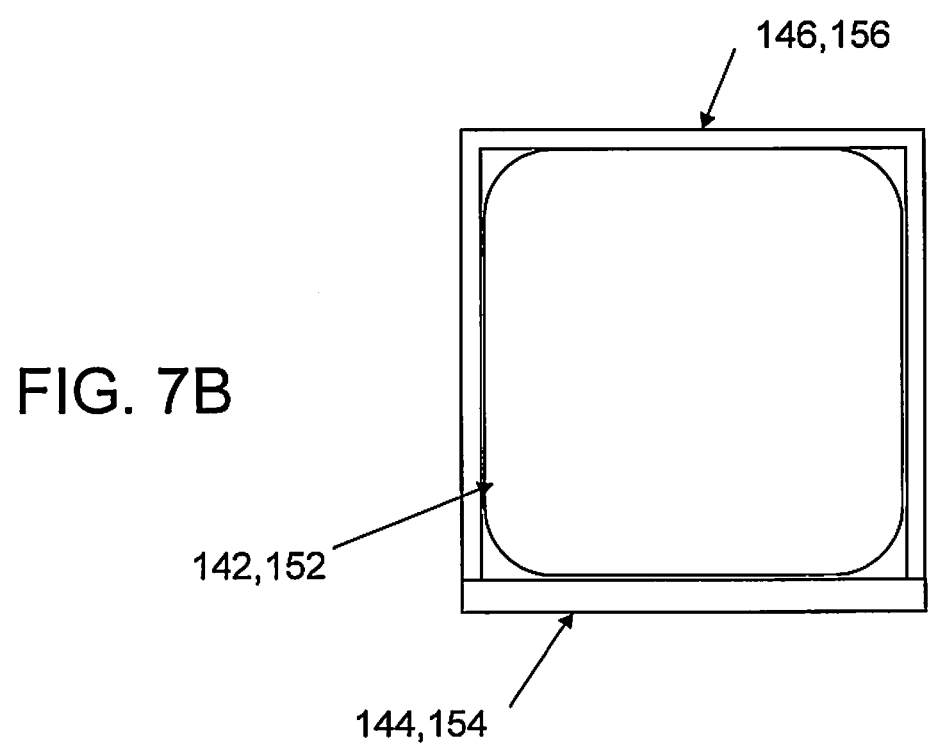

FIG. 7A shows a schematic cross-section of the known clamp meter shown in FIG. 6. In particular, the joint or seam coupling the two housing pieces is centered along a side of the current sensor. In contrast, FIG. 7B shows a schematic cross-section of the clamp meter shown in FIG. 1. Embodiments according to the present disclosure relocate the coupling between the base 144,154 and the cover 146,156 proximate to a corner of the current sensor.

An advantage of embodiments according to the present invention is reducing the cross-sectional size of the fixed jaw 140 and the pivotable jaw 150. The thickness "T" (FIG. 4) of the jaw assembly 110 is reduced by approximately 30% or more as compared to the known jaw assembly (FIG. 6) because the end caps 148 and 158 are integrally formed with the bases 144 and 154. For example, the thickness T of the known jaw assembly is approximately 18.5 millimeters whereas the thickness T of the jaw assembly 110 is approximately 13 millimeters. The reduced cross-sectional size of the jaw assembly 110 therefore enables a user to reach and readily single-out a desired wire from amongst adjacent wires.

Another advantage of embodiments according to the present invention is simplifying the jaw assembly 110 as compared to the known jaw assembly (FIG. 6). The assembly is simplified by reducing the number of steps needed for assembly because the end caps 148 and 158 are integrally formed with the bases 144 and 154 rather than being separately attached.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof, means any connection or coupling, either direct or indirect, between two or more elements; the coupling of connection between the elements can be physical, logical, or a combination thereof. Additionally, the words "herein," "above," "below," and words of similar import, when used in this patent application, shall refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above detailed description of embodiments of the disclosure is not intended to be exhaustive or to limit the teachings to the precise form disclosed above. While specific embodiments of, and examples for, the disclosure are described above for illustrative purposes, various equivalent modifications are possible within the scope of the disclosure, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified to provide alternative or sub-combinations. Each of these processes or blocks may be implemented in a variety of different ways. Also, while processes or blocks are at times shown as being performed in series, these processes or blocks may instead be performed in parallel, or may be performed at different times. Further any specific numbers noted herein are only examples: alternative implementations may employ differing values or ranges.

The teachings of the disclosure provided herein can be applied to other systems, not necessarily the system described above. The elements and acts of the various embodiments described above can be combined to provide further embodiments.

While the above description describes certain embodiments of the disclosure, and describes the best mode contemplated, no matter how detailed the above appears in text, the teachings can be practiced in many ways. Details of the system may vary considerably in its implementation details, while still being encompassed by the subject matter disclosed herein. As noted above, particular terminology used when describing certain features or aspects of the disclosure should not be taken to imply that the terminology is being redefined herein to be restricted to any specific characteristics, features, or aspects of the disclosure with which that terminology is associated. In general, the terms used in the following claims should not be construed to limit the disclosure to the specific embodiments disclosed in the specification, unless the above Detailed Description section explicitly defines such terms. Accordingly, the actual scope of the disclosure encompasses not only the disclosed embodiments, but also all equivalent ways of practicing or implementing the disclosure under the claims.

What is claimed is:

1. A jaw of a clamp meter for measuring current flow in a wire, the jaw comprising:
    a current sensor for measuring a current flow;
    a shield adjacent to the current sensor and enclosing the current sensor, the shield including—
    a cover defining a channel having a volume at least as great as the current sensor; and
    a base occluding the channel, wherein a seam is formed extending from an exterior side to an interior side of the jaw where the base is joined to the cover, and the seam is located on the interior side of the jaw where a distance from an interior side of the cover to the current sensor is greatest;
    wherein the cover and base define a pocket including the channel.

2. The jaw of claim 1, wherein the channel has a volume approximately as large as the current sensor.

3. The jaw of claim 1, wherein the base includes caps disposed at opposite ends of the current sensor.

4. The jaw of claim 3, wherein the base and the caps define an integrally-formed monolithic structure.

5. The jaw of claim 1, wherein the cover is coupled to the base by at least one of adhering, welding, and bonding.

6. The jaw of claim 1, wherein the current sensor is disposed in the pocket.

7. The jaw of claim 1, wherein at least one of the cover and the base include a spacer positioning the current sensor in the pocket.

8. The jaw of claim 7, wherein the at least one spacer centers the current sensor in the pocket.

9. The jaw of claim 1, wherein the shield has an approximately rectangular cross-section having first, second, third and fourth sides, the cover comprises the first, second and third sides, and the base comprises the fourth side.

10. The jaw of claim 1, wherein the base comprises a substantially flat plate.

11. The multimeter of claim 1, wherein the seam on the interior side of the jaw is separated from the current sensor by a largest air gap created between the shield and the current sensor.

12. The multimeter of claim 1, wherein the seam on the interior side of the jaw is located adjacent to a rounded corner of the current sensor where two lateral sides of the current sensor meet.

13. Jaws of a clamp meter for measuring current flow in a wire, the jaws comprising:
- a current sensor configured to have an open arrangement and a closed arrangement, the current sensor including a first portion and a second portion;
- a first shield adjacent to the first portion of the current sensor and enclosing the first portion of the current sensor, the first shield including—
- a first cover defining three of four sides covering the first portion of the current sensor; and
- a first base defining a fourth side covering the first portion of the current sensor, the first base including first caps disposed at opposite ends of the first portion of the current sensor;
- wherein the first cover and the first base define a first pocket receiving the first portion of the current sensor, wherein a first seam is formed extending from an exterior side to an interior side of a first jaw where the first base is joined to the first cover, and the first seam is located on the interior side of the first jaw where a distance from an interior side of the first shield to the current sensor is greatest;
- a second shield adjacent to the second portion of the current sensor and enclosing the second portion of the current sensor, the second shield including—
- a second cover defining three of four sides covering the second portion of the current sensor; and
- a second base defining a fourth side covering the second portion of the current sensor, the second base including second caps disposed at opposite ends of the second portion of the current sensor;
- wherein the second cover and the second base define a second pocket receiving the second portion of the current sensor, wherein a second seam is formed extending from an exterior side to an interior side of a second jaw where the second base is joined to the second cover, and the second seam is located on the interior side of the second jaw where a distance from an interior side of the second shield to the current sensor is greatest.

14. The jaws of claim 13, wherein the first and second portions surround the wire in the closed arrangement.

15. The jaws of claim 13, wherein the second portion of the current sensor is relatively movable with respect to the first portion of the current sensor between the open and closed arrangements.

16. The jaws of claim 15, wherein the second portion of the current sensor is relatively pivotal with respect to the first portion of the current sensor.

17. The multimeter of claim 13, wherein the first seam on the interior side of the first jaw is separated from the first current sensor portion by a largest air gap created between the first shield and the first current sensor portion, and the second seam on the interior side of the second jaw is separated from the second current sensor portion by a largest air gap created between the second shield and the second current sensor portion.

18. The multimeter of claim 13, wherein the first seam on the interior side of the first jaw is located adjacent to a rounded corner of the first current sensor portion where two lateral sides of the first current sensor portion meet, and the second seam on the interior side of the second jaw is located adjacent to a rounded corner of the second current sensor portion where two lateral sides of the second current sensor portion meet.

19. A multimeter comprising:
- a housing;
- a first jaw fixed to the housing, the first jaw having a first portion of a current sensor and a first shield adjacent to the first portion of the current sensor and enclosing the first portion of the current sensor, the first shield including—
- a first cover defining a first channel having a volume at least as large as the first portion of the current sensor; and
- a first base occluding the first channel, the first base including first caps disposed at opposite ends of the first portion of the current sensor, wherein a first seam is formed extending from an exterior side to an interior side of the first jaw where the first base is joined to the first cover, and the first seam is located on the interior side of the first jaw where a distance from an interior side of the first shield to the current sensor is greatest;
- a second jaw pivotally coupled to the housing, the second jaw having a second portion of the current sensor and a second shield adjacent to the second portion of the current sensor and enclosing the second portion of the current sensor, the second shield including—
- a second cover defining a second channel having a volume at least as large as the second portion of the current sensor; and
- a second base occluding the second channel, the second base including second caps disposed at opposite ends of the second portion of the current sensor, wherein a second seam is formed extending from an exterior side to an interior side of the second jaw where the second base is joined to the second cover, and the second seam is located on the interior side of the second jaw where a distance from an interior side of the second shield to the current sensor is greatest;
- a processor disposed in the housing, the processor receiving a signal from the current sensor and computing a current flow value; and
- a display showing the current flow value.

20. The multimeter of claim 19, wherein the first and second jaws are moveable between an open arrangement receiving a wire carrying current and a closed arrangement cincturing the wire.

21. The multimeter of claim 20, further comprising a lever coupled to the second jaw, the lever pivoting the second jaw between the open and closed arrangements.

22. The multimeter of claim 19, further comprising a user interface including the display, the user interface receiving an input from a user and providing information to the user.

23. The multimeter of claim 19, wherein the processor comprises at least one of a signal conditioner and an analog-to-digital converter.

24. The multimeter of claim 19, further comprising electrical terminals disposed on the housing, the electrical terminals being coupled to test probes.

25. The multimeter of claim 19, wherein the first seam on the interior side of the first jaw is separated from the first current sensor portion by a largest air gap created between the first shield and the first current sensor portion, and the second seam on the interior side of the second jaw is separated from the second current sensor portion by a largest air gap created between the second shield and the second current sensor portion.

26. The multimeter of claim 19, wherein the first seam on the interior side of the first jaw is located adjacent to a rounded corner of the first current sensor portion where two lateral sides of the first current sensor portion meet, and the second seam on the interior side of the second jaw is located adjacent to a rounded corner of the second current sensor portion where two lateral sides of the second current sensor portion meet.

* * * * *